United States Patent
Risaki

(10) Patent No.: US 10,497,706 B2
(45) Date of Patent: Dec. 3, 2019

(54) SEMICONDUCTOR DEVICE AND METHOD OF MANUFACTURING THE SAME

(71) Applicant: ABLIC Inc., Chiba-shi, Chiba (JP)

(72) Inventor: Tomomitsu Risaki, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/285,834

(22) Filed: Feb. 26, 2019

(65) Prior Publication Data

US 2019/0189623 A1 Jun. 20, 2019

Related U.S. Application Data

(62) Division of application No. 15/927,487, filed on Mar. 21, 2018, now Pat. No. 10,263,003.

(30) Foreign Application Priority Data

Mar. 24, 2017 (JP) ................. 2017-059968

(51) Int. Cl.
| | | |
|---|---|---|
| *H01L 27/115* | (2017.01) | |
| *H01L 29/788* | (2006.01) | |
| *H01L 21/822* | (2006.01) | |
| *G11C 16/04* | (2006.01) | |
| *C23C 16/24* | (2006.01) | |
| *G11C 11/34* | (2006.01) | |

(Continued)

(52) U.S. Cl.
CPC ............ *H01L 27/115* (2013.01); *C23C 16/24* (2013.01); *G11C 11/34* (2013.01); *G11C 16/0483* (2013.01); *H01L 21/283* (2013.01); *H01L 21/822* (2013.01); *H01L 29/40114* (2019.08); *H01L 29/788* (2013.01); *G11C 16/0433* (2013.01)

(58) Field of Classification Search
CPC ......... H01L 27/11517; H01L 27/11524; H01L 29/788; H01L 29/7883; G11C 16/0408; G11C 16/0433
See application file for complete search history.

(56) References Cited

U.S. PATENT DOCUMENTS

| | | | | |
|---|---|---|---|---|
| 2008/0054343 A1* | 3/2008 | Hwang | ................. | H01L 27/115 257/321 |
| 2009/0026529 A1* | 1/2009 | Akahori | ................ | H01L 27/115 257/324 |
| 2015/0236136 A1* | 8/2015 | Chiu | ................. | H01L 29/66825 257/316 |

FOREIGN PATENT DOCUMENTS

| | | |
|---|---|---|
| JP | H11-003948 A | 1/1999 |
| JP | 2001-135729 A | 5/2001 |

(Continued)

*Primary Examiner* — Allison Bernstein
(74) *Attorney, Agent, or Firm* — Brinks Gilson & Lione

(57) ABSTRACT

Provided is a semiconductor device which has a non-volatile memory including: a semiconductor substrate; a tunnel insulating film formed on a surface of the semiconductor device; a floating gate formed on the tunnel insulating film; a memory cell transistor drain region and a memory cell transistor source region formed from the surface to an inside of the semiconductor substrate in a vicinity of both ends of the floating gate; a first interface formed between the semiconductor substrate and the tunnel insulating film; and a second interface formed between the floating gate and the tunnel insulating film. The first interface and the second interface form an uneven structure having a curvature that changes at an identical period with respect to a place in sectional view.

1 Claim, 12 Drawing Sheets

(51) Int. Cl.
*H01L 21/283* (2006.01)
*H01L 21/28* (2006.01)

(56) References Cited

FOREIGN PATENT DOCUMENTS

| | | |
|---|---|---|
| JP | 2004-071077 A | 3/2004 |
| JP | 2004-158074 A | 6/2004 |

* cited by examiner

Prior Art

Prior Art

Prior Art

SEMICONDUCTOR DEVICE AND METHOD OF MANUFACTURING THE SAME

RELATED APPLICATIONS

This application is a divisional patent application of U.S. application Ser. No. 15/927,487, filed Mar. 21, 2018, which claims priority under 35 U.S.C. § 119 to Japanese Patent Application No. 2017-059968 filed on Mar. 24, 2017, the entire content of which is hereby incorporated by reference.

BACKGROUND OF THE INVENTION

1. Field of the Invention

The present invention relates to a semiconductor device and a method of manufacturing the semiconductor device.

2. Description of the Related Art

A related-art non-volatile semiconductor memory device is described by taking an EEPROM as an instance. FIG. 8 is a simplified cross-sectional view for illustrating a memory cell structure of a related-art EEPROM having a general structure which is disclosed, for example, in Japanese Patent Application Laid-open No. 2004-71077.

A memory cell includes a memory cell transistor portion 002 and a select gate transistor portion 001 configured to select the memory cell transistor portion 002. In the memory cell transistor portion 002, an electrode called a floating gate 013 configured to accumulate charge is formed on a tunnel insulating film 010 and a memory cell gate oxide film 012. When electrons are accumulated in the floating gate 013, a threshold value of the memory cell transistor portion 002 becomes enhancement to reach a "1" state. When holes are accumulated in the floating gate 013, the threshold value of the memory cell transistor portion 002 becomes depletion to reach a "0" state.

Writing for achieving the "1" state involves applying a positive voltage to a select gate 003 formed on a select gate oxide film 004 and to a control gate 015 formed above the floating gate 013, setting the potentials of an n-type select transistor drain region 005, an n-type memory cell transistor source region 011, and a p-type semiconductor substrate 006 to GND, and injecting electrons into the floating gate 013 from an n-type tunnel drain region 009 through the tunnel insulating film 010.

The above-mentioned process is described below with reference to band diagrams. The GND potentials of the n-type select transistor drain region 005 and the n-type memory cell transistor source region 011 are transmitted to an n-type select transistor source region (which also serves as an n-type memory cell transistor drain region) 008 and an n-type region 007 that is in contact with the n-type select transistor source region 008, and hence the potentials of the n-type select transistor source region 008 and the n-type region 007 are also set to GND.

FIG. 9A, FIG. 9B, and FIG. 9C are each a band diagram for illustrating a change in band when the "1" state is written, and are taken along the line segment E-E' of the memory cell illustrated in FIG. 8. Band structure for the band diagrams is illustrated to have the control gate 015, a floating gate-control gate insulating film 014, the floating gate 013, the tunnel insulating film 010, and the n-type tunnel drain region 009 in order from the left. The p-type semiconductor substrate 006 is omitted. Reference symbols $E_F$, $E_C$, and $E_V$ in FIG. 9A denote a Fermi level, a lower part of a conduction band, and an upper part of a valence band, respectively. In the band diagrams, it is assumed that the floating gate 013 and the control gate 015 are made of n-type polycrystalline silicon.

When a write voltage is applied for the "1" state described above to a thermal equilibrium state illustrated in FIG. 9A, that is, the potential of the n-type tunnel drain region 009 is set to GND, and the potential of the control gate 015 is set to a positive voltage in a memory cell transistor, the band diagram illustrated in FIG. 9B is obtained. Then, electrons 018 are injected into the floating gate 013 from the n-type tunnel drain region 009 through the tunnel insulating film 010 by a Fowler-Nordheim (FN) current mechanism as indicated by the arrow in FIG. 9B. The potential of the floating gate 013 having the electrons 018 injected thereinto decreases, and the electron energy level increases as indicated by the white blank arrow in FIG. 9C. When the potential applied to the tunnel insulating film 010 is weakened to stop the FN current, the write operation of the "1" state is completed.

Next, the "0" state is explained. Writing for achieving the "0" state involves applying a positive voltage to the select gate 003 and the n-type select transistor drain region 005, connecting the control gate 015 and the p-type semiconductor substrate 006 to GND, floating the n-type memory cell transistor source region 011, and injecting holes into the floating gate 013 from the n-type tunnel drain region 009 through the tunnel insulating film 010. This process is described below with reference to band diagrams.

FIG. 10A, FIG. 10B, and FIG. 10C are each a band diagram taken along the line segment E-E' of the memory cell illustrated in FIG. 8 at the time of "0" state writing. In the same manner as in FIG. 9A to FIG. 9C, the p-type semiconductor substrate 006 is omitted, and reference symbols $E_F$, $E_C$, and $E_V$ represent a Fermi level, a lower part of a conduction band, and an upper part of a valence band, respectively. Further, it is assumed that the floating gate 013 and the control gate 015 are made of n-type polycrystalline silicon.

When a write voltage is applied for the "0" state described above to a memory cell transistor in a thermal equilibrium state illustrated in FIG. 10A, that is, the potential of the control gate 015 is set to GND, and the potential of the n-type tunnel drain region 009 is set positive, the band diagram illustrated in FIG. 10B is obtained. Then, electrons 018 are discharged to the n-type tunnel drain region 009 from the floating gate 013 through the tunnel insulating film 010 by a Fowler-Nordheim (FN) current mechanism as indicated by the arrow in FIG. 10B. In other words, holes are injected into the floating gate 013. The potential of the floating gate 013 having the reduced electrons 018 increases, and the electron energy level decreases as indicated by the white blank arrow in FIG. 10C. When the potential applied to the tunnel insulating film 010 is weakened to stop the FN current, the write operation of the "0" state is completed.

With the non-volatile semiconductor memory device in which charge is exchanged through the tunnel insulating film, stress on the tunnel insulating film caused by rewriting between the "0" state and the "1" state as described above deteriorates the tunnel insulating film, and finally causes breakage of the tunnel insulating film. The rewrite frequency until the original memory function is lost due to the above-mentioned deterioration and breakage is called endurance. Further, the deterioration and breakage are greatly associated also with a data storage function of a memory. The data storage function is called retention. Improvement of those characteristics is the most important issue in a memory using the tunnel insulating film.

There have been proposed procedures for improving the endurance and the retention. For example, Japanese Patent Application Laid-open No. 2004-158074 is an invention relating to the operation condition of a memory, disclosing a procedure for suppressing stress on the tunnel insulating film by controlling the gradient of a write voltage pulse.

Further, Japanese Patent Application Laid-open No. H 11-003948 is an invention relating to the process condition of a memory, disclosing a procedure for improving the quality of the tunnel insulating film by suppressing impurity diffusion into the tunnel insulating film.

Further, Japanese Patent Application Laid-open No. 2001-135729 is an invention relating to the structure of a memory, disclosing a procedure for enabling a low-voltage write operation by forming an uneven structure on a surface of the tunnel insulating film in contact with a floating gate, to thereby suppress stress.

The procedures disclosed in Japanese Patent Application Laid-open Nos. 2004-158074, H 11-003948, and 2001-135729 may also be combined to obtain combined benefits thereof.

It is, however, considered to be difficult to improve the endurance by the procedure described in Japanese Patent Application Laid-open No. 2001-135729. The benefit described in Japanese Patent Application Laid-open No. 2001-135729 can be summarized as follows: Since the electric field intensity increases in a (local) uneven shape at an interface between the floating gate and the tunnel insulating film, and operations of writing and erasing information can be performed even with a voltage lower than that of the related art, the voltage can be decreased even without reducing the thickness of the tunnel insulating film, with the result that the retention and endurance are improved. As far as a schematic view of the tunnel insulating film having local unevenness which is the main point of the invention of Japanese Patent Application Laid-open No. 2001-135729 is considered, it is difficult to obtain the above-mentioned benefit.

FIG. 11A is the schematic view of the tunnel insulating film. A floating gate 013 made of polycrystalline silicon is formed on a tunnel insulating film 010 formed on a surface of a semiconductor substrate 100. Further, gaps between grains 101 of the polycrystalline silicon are filled with $SiO_2$ particles 102, and hence the tunnel insulating film 010 and the floating gate 013 form a local uneven structure at the interface therebetween. The local uneven structure is illustrated in a partially enlarged state in FIG. 11B, and the local uneven structure can be roughly divided into two regions A and B. The region A corresponds to a region including only the tunnel insulating film 010, and the region B corresponds to a region in which the $SiO_2$ particles 102 are deposited on the tunnel insulating film 010. Now, when it is assumed that a voltage is applied to the floating gate 013, the electric field of the region A becomes higher than that of the region B, and the charge for writing passes through only the region A. Accordingly a film thickness of the region A denoted by D1 should be set to have a tunnel insulating film thickness optimum for writing, and this thickness is the same as that of the related-art tunnel insulating film having no uneven structure.

When the value of d1 is defined as the tunnel insulating film thickness, it cannot be said that "the voltage can be decreased even without reducing the thickness of the tunnel insulating film". This is because d1 is the same as the thickness of the related-art tunnel insulating film having no uneven structure as described above.

Meanwhile, when a value of d2 is defined as the tunnel insulating film thickness, d2 is larger than d1 corresponding to the thickness of the related-art tunnel insulating film having no uneven structure, and hence it can be said that "the voltage can be decreased even without reducing the thickness of the tunnel insulating film". However, this is merely the appearance. The electric field applied to the region A is the same as that of the related-art tunnel insulating film having no uneven structure (having no region B), and hence the charge for writing passes through the region A in the same manner as in the related-art tunnel insulating film having no uneven structure instead of passing through the region B having d2 defined as the tunnel insulating film thickness. Thus, it is considered to be difficult to improve the endurance and retention with the structure of Japanese Patent Application Laid-open No. 2001-135729. On the contrary, since the area of the region A of Japanese Patent Application Laid-open No. 2001-135729 is smaller than that of the region A of the related art that does not include the region B, stress applied on the region A per unit area in Japanese Patent Application Laid-open No. 2001-135729 is higher than that of the related art, and hence, in Japanese Patent Application Laid-open No. 2001-135729, there is a high risk in that the endurance and retention are deteriorated.

Accordingly, it is difficult to improve the endurance and retention with the structure having the local uneven structure at the interface between the floating gate and the tunnel insulating film.

SUMMARY OF THE INVENTION

In view of the foregoing, it is an object of the present invention to provide a non-volatile memory in which retention and endurance are improved through formation of a non-local uneven structure, and a write voltage is decreased.

In order to solve the above-mentioned problems, the following semiconductor device is provided. That is, there is provided a semiconductor device including: a semiconductor substrate; a tunnel insulating film formed on a surface of the semiconductor device; a floating gate formed on the tunnel insulating film; a memory cell transistor drain region and a memory cell transistor source region formed from the surface to an inside of the semiconductor substrate in a vicinity of both ends of the floating gate; a first interface formed between the semiconductor substrate and the tunnel insulating film; and a second interface formed between the floating gate and the tunnel insulating film, the first interface and the second interface forming an uneven structure having a curvature that changes at an identical period with respect to a place in sectional view.

Further, in order to solve the above-mentioned problems, the following method of manufacturing a semiconductor device is provided. That is, there is provided a method of manufacturing a semiconductor device, the semiconductor device including: a semiconductor substrate; a tunnel insulating film formed on a surface of the semiconductor device; a floating gate formed on the tunnel insulating film; and a memory cell transistor drain region and a memory cell transistor source region formed from the surface to an inside of the semiconductor substrate in a vicinity of both ends of the floating gate, the method including: preparing an etching mask formed on the semiconductor substrate; etching the semiconductor substrate with an etchant having an etching rate varied depending on a plane orientation of the semiconductor substrate; and forming the tunnel insulating film on a surface of the etched semiconductor substrate.

The retention and the endurance of the non-volatile memory are improved. Further, the write voltage can be decreased.

BRIEF DESCRIPTION OF THE DRAWINGS

FIG. 3A, FIG. 3B, and FIG. 3C are each a band diagram of the vicinity of the tunnel insulating film of FIG. 2A and FIG. 2B, in which FIG. 3A is a band diagram of a region C of FIG. 2A and FIG. 2B, FIG. 3B is a band diagram of an intermediate region between the region C and a region D of FIG. 2A and FIG. 2B, and FIG. 3C is a band diagram of the region D of FIG. 2A and FIG. 2B.

FIG. 5A, FIG. 5B, and FIG. 5C are each a band diagram of the vicinity of the tunnel insulating film of FIG. 4A and FIG. 4B, in which FIG. 5A is a band diagram of a region C of FIG. 4A and FIG. 4B, FIG. 5B is a band diagram of an intermediate region between the region C and a region D of FIG. 4A and FIG. 4B, and FIG. 5C is a band diagram of the region D of FIG. 4A and FIG. 4B.

FIG. 9A, FIG. 9B, and FIG. 9C are each a band diagram taken along the line segment E-E' of the related-art EEPROM illustrated in FIG. 8, for illustrating "1" state writing, in which FIG. 9A is a band diagram for illustrating a thermal equilibrium state, FIG. 9B is a band diagram for illustrating an initial stage of the "1" state writing, and FIG. 9C is a band diagram at the time of completion of the "1" state writing.

FIG. 10A, FIG. 10B, and FIG. 10C are each a band diagram taken along the line segment E-E' of the related-art EEPROM illustrated in FIG. 8, for illustrating "0" state writing, in which FIG. 10A is a band diagram for illustrating a thermal equilibrium state, FIG. 10B is a band diagram for illustrating an initial stage of the "0" state writing, and FIG. 10C is a band diagram at the time of completion of the "0" state writing.

DETAILED DESCRIPTION OF THE EMBODIMENTS

Now, embodiments of the present invention are described with reference to the drawings.

Figure 1:
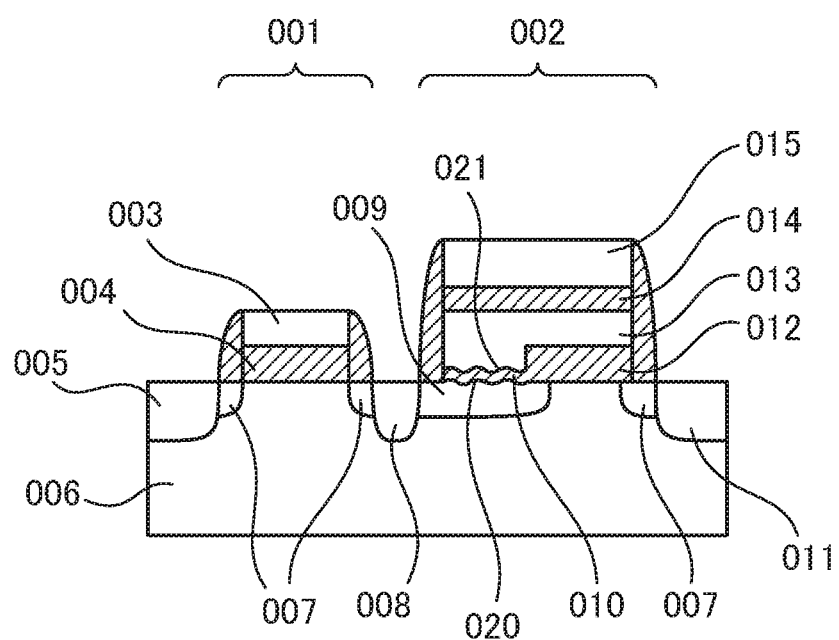
FIG. 1 is a sectional view for illustrating an EEPROM in an embodiment of the present invention.

FIG. 1 is a sectional view for illustrating an EEPROM in an embodiment of the present invention.

Figure 8:
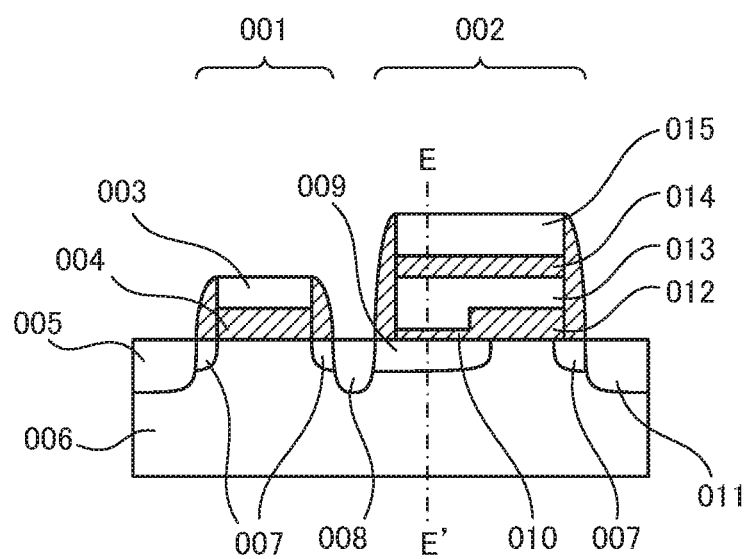
FIG. 8 is a sectional view for illustrating a related-art EEPROM.
Figure 9A:
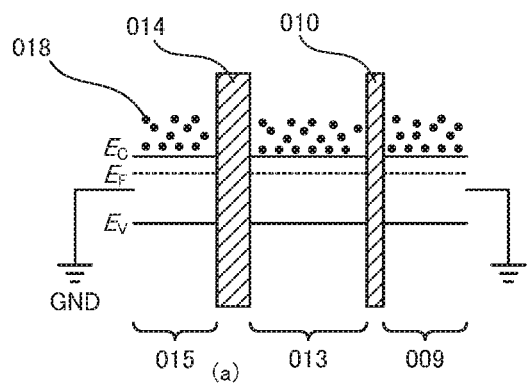
Figure 9B:
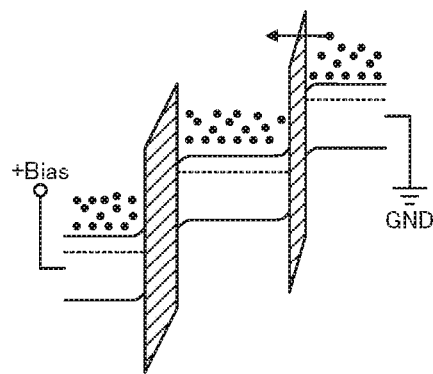
Figure 9C:
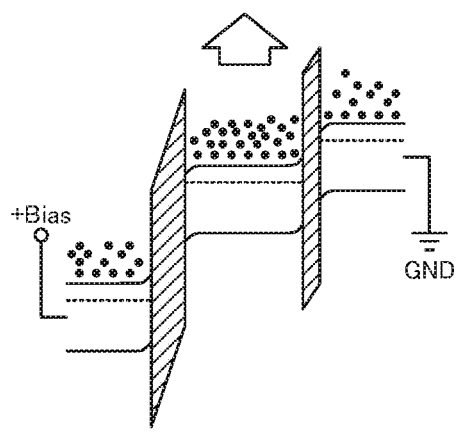
Figure 10A:
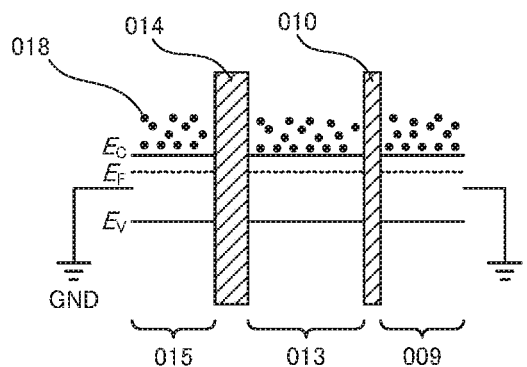
Figure 10B:
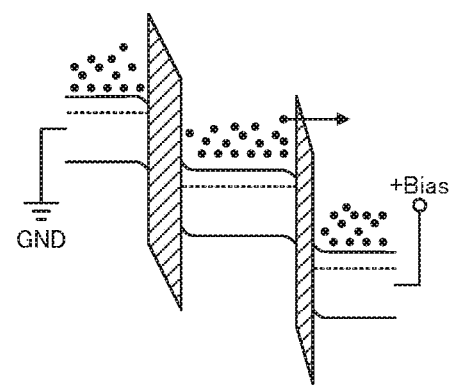
Figure 10C:
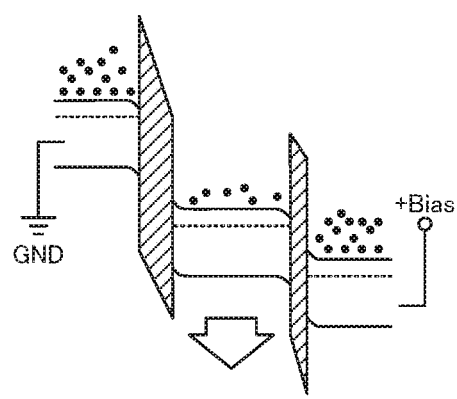

The EEPROM in the embodiment of the present invention includes a memory cell transistor portion 002 and a select gate transistor portion 001 configured to select the memory cell transistor portion 002 in the same manner as in the related-art EEPROM illustrated in FIG. 8.

The select gate transistor portion 001 includes n-type regions 007 to be source and drain regions formed in a p-type semiconductor substrate 006 or a p-type well region, an n-type select transistor drain region 005 and an n-type select transistor source region 008 formed continuously from the n-type regions 007, a select gate oxide film 004 formed on a surface of the p-type semiconductor substrate 006 or the p-type well region, and a select gate 003 formed on the select gate oxide film 004. In general, the periphery of the select gate 003 is further covered with an interlayer insulating film, but the interlayer insulating film is omitted for simplicity in FIG. 1.

The memory cell transistor portion 002 includes an n-type tunnel drain region 009 formed from the surface to an inside of the p-type semiconductor substrate 006 or the p-type well region continuously from an n-type memory cell transistor drain region 008 also serving as the n-type select transistor source region, an n-type region 007 to be a source region which is arranged so as to be opposed to the n-type tunnel drain region 009 and an n-type memory cell transistor source region 011 formed continuously from the n-type region 007, a tunnel insulating film 010 formed on a surface of the n-type tunnel drain region 009 and a memory cell gate oxide film 012 formed continuously from the tunnel insulating film 010, and a floating gate 013, a floating gate-control gate insulating film 014, and a control gate 015 which are stacked on the tunnel insulating film 010 and the memory cell gate oxide film 012 in the state order from the bottom. In general, the periphery of the control gate 015 is further covered with an interlayer insulating film, but the interlayer insulating film is omitted for simplicity in FIG. 1.

The operation principle of the EEPROM in the embodiment of the present invention is basically the same as that of the above-mentioned related-art EEPROM macroscopically but is different therefrom microscopically. A structural difference requiring the microscopically different operation principle is given below. The structural difference resides in that a first interface 020 formed by the tunnel insulating film 010 and the n-type tunnel drain region 009 and a second interface 021 formed by the tunnel insulating film 010 and the floating gate 013 form an uneven structure (corrugated structure) in which the first interface 020 and the second interface 021 change together, each having a curvature that changes at an identical period with respect to a place in sectional view. The corrugated structure is schematically illustrated in FIG. 1. The uneven structure is non-locally formed in the semiconductor substrate 006, the tunnel insulating film 010, and the floating gate 013, and it can also be said that the uneven structure is globally formed.

Figure 2A:
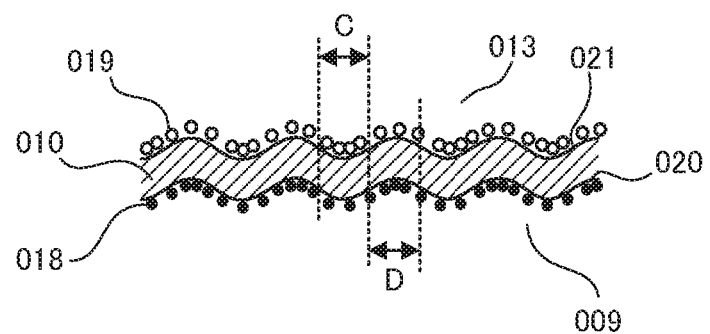
FIG. 2A is an enlarged view of a tunnel insulating film when a "1" state write voltage is applied to the EEPROM in the embodiment illustrated in FIG. 1.

FIG. 2A is a sectional view for illustrating an enlarged vicinity of the tunnel insulating film 010 at the time of the "1" state writing. First, description is given of a shape. As illustrated in FIG. 2A, the first interface 020 formed by the tunnel insulating film 010 and the n-type tunnel drain region 009 and the second interface 021 formed by the tunnel insulating film 010 and the floating gate 013 each change at an identical period while maintaining an interval therebetween to form an uneven structure in sectional view. That is, in an area in which the first interface 020 is protruded when viewed from the n-type tunnel drain region 009, the second interface 021 is recessed when viewed from the floating gate 013. Meanwhile, in an area in which the first interface 020 is recessed when viewed from the n-type tunnel drain region 009, the second interface 021 is protruded when viewed from the floating gate 013. In this case, it is preferred that a change in curvature indicating a sectional shape of the uneven structure be smooth. The change in curvature is not the same between the first interface 020 at a lower position and the second interface 021 at an upper position. In an area in which the first interface 020 at the lower position is protruded upward, the curvature of the first interface 020 is larger than that of the second interface 021 at the upper position. Meanwhile, in an area in which the first interface 020 at the lower position is protruded downward, the curvature of the first interface 020 is smaller than that of the second interface 021 at the upper position. The purpose of this configuration is to set the interval between the first interface 020 and the second interface 021 to be substantially the same. The term "interval" as used herein refers to a minimum length among lengths from a certain point to an opposed surface.

The "1" state writing is illustrated in FIG. 2A, and since a positive potential is applied to the floating gate 013 when viewed from the n-type tunnel drain region 009, electrons are collected on the first interface 020 formed by the tunnel insulating film 010 and the n-type tunnel drain region 009, and holes are collected on the second interface 021 formed by the tunnel insulating film 010 and the floating gate 013. Further, due to the corrugated structure, the number of charges to be collected varies to change charge density depending on a place of the first interface 020 and the second interface 021.

Figure 2B:
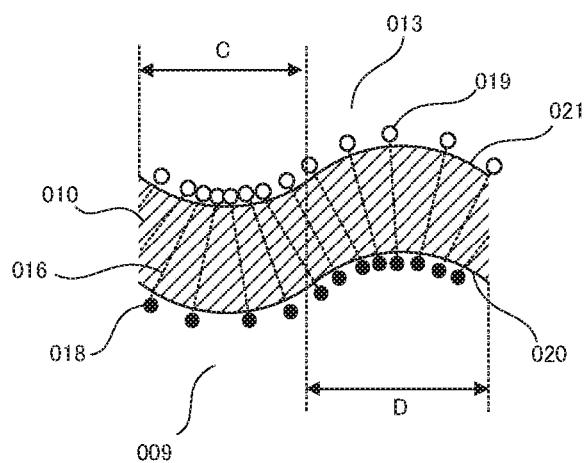
FIG. 2B is a further enlarged view of FIG. 2A.

FIG. 2B is obtained by partially enlarging FIG. 2A, in which electrical lines of force is illustrated. The charge density varies depending on a place of the first interface 020 and the second interface 021, and hence the density of the electrical lines of force varies depending on a place in a normal direction of the first interface 020 and the second interface 021, with the result that the electric field intensity varies depending on a place in the normal direction of the first interface 020 and the second interface 021.

Figure 3A:
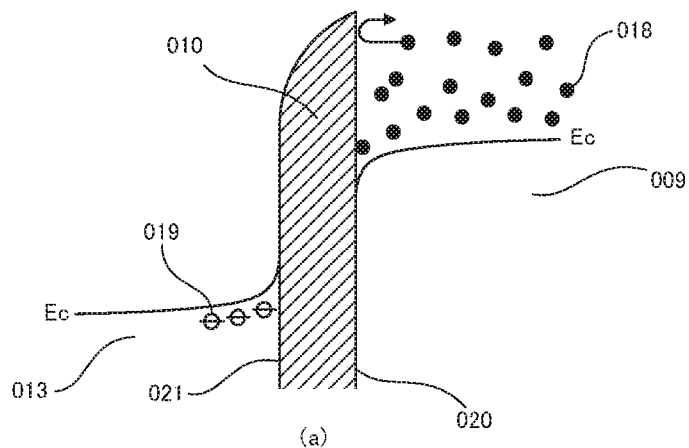
Figure 3B:
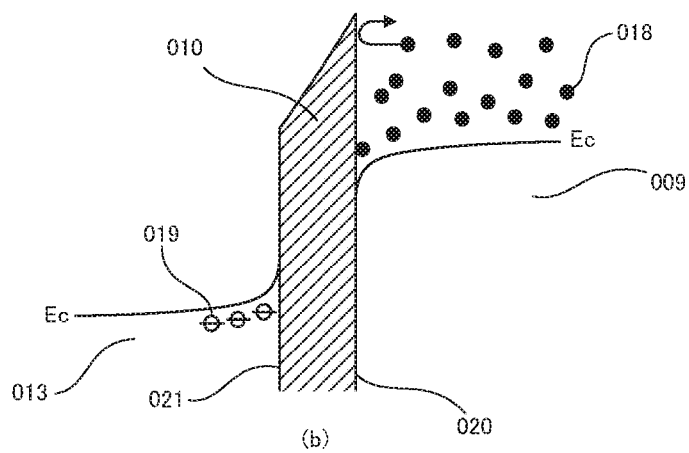
Figure 3C:
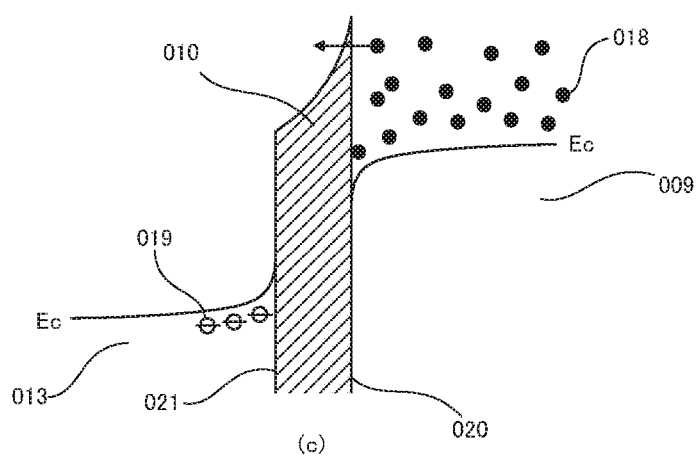

FIG. 3A, FIG. 3B, and FIG. 3C are each a band diagram for illustrating a difference in electric field intensity applied to the tunnel insulating film 010 in this case. FIG. 3A is a band diagram of a region C of FIG. 2A and FIG. 2B. FIG. 3B is a band diagram of an intermediate region between the region C and a region D of FIG. 2A and FIG. 2B. FIG. 3C is a band diagram of the region D of FIG. 2A and FIG. 2B. As can be understood from FIG. 3A to FIG. 3C, since in the region D of FIG. 2A and FIG. 2B illustrated in FIG. 3C, an electric field applied to the tunnel insulating film 010 gradually increases from the second interface 021 to the first interface 020, the band diagram of the tunnel insulating film 010 is curved downward, and the width of a potential barrier is small in a region close to the first interface 020. Thus, an FN tunnel current is likely to flow in the region D of FIG. 3C, and hence the charge passes selectively through only the region D by adjusting a "1" state write voltage.

Figure 4A:
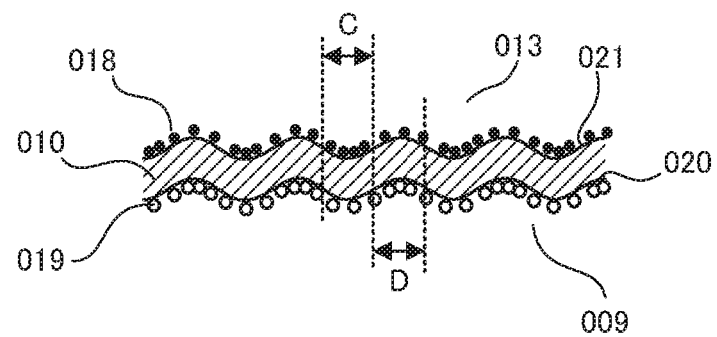
FIG. 4A is an enlarged view of the tunnel insulating film when a "0" state write voltage is applied to the EEPROM in the embodiment illustrated in FIG. 1.

Next, the "0" state writing is considered. FIG. 4A is a sectional view of an enlarged vicinity of the tunnel insulating film 010 at the time of the "0" state writing. Since a positive potential is applied to the n-type tunnel drain region 009 when viewed from the floating gate 013, holes are collected on the first interface 020 formed by the tunnel insulating film 010 and the n-type tunnel drain region 009, and electrons are collected on the second interface 021 formed by the tunnel insulating film 010 and the floating gate 013. Further, due to the corrugated structure, the number of charges to be collected varies to change charge density depending on a place.

Figure 4B:
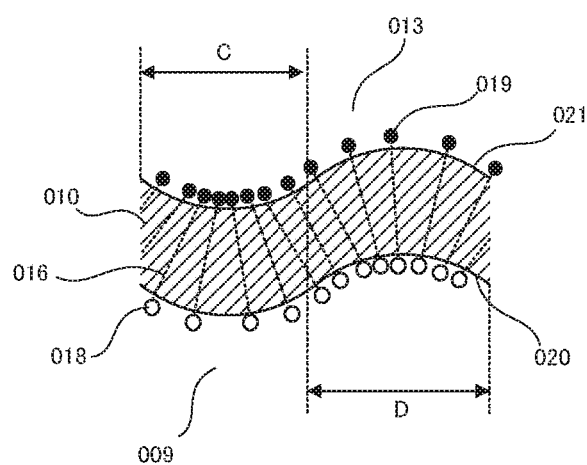
FIG. 4B is a further enlarged view of FIG. 4A.
Figure 5A:
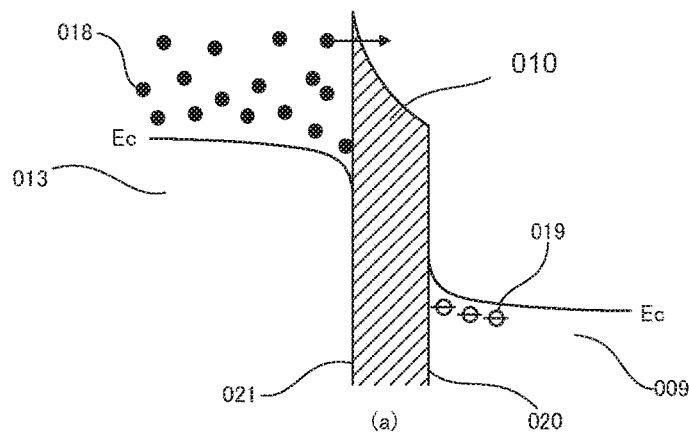
Figure 5B:
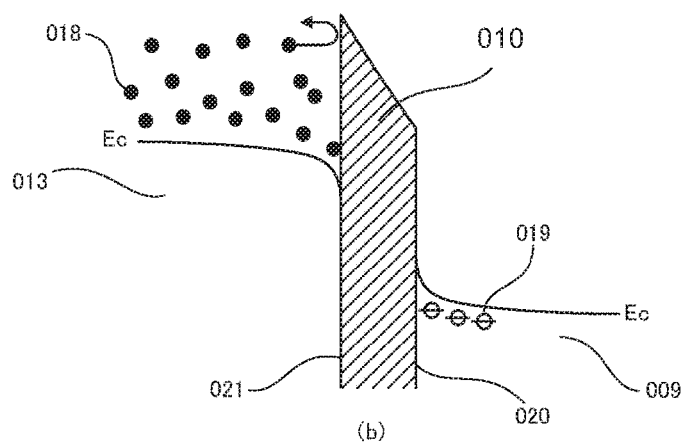
Figure 5C:
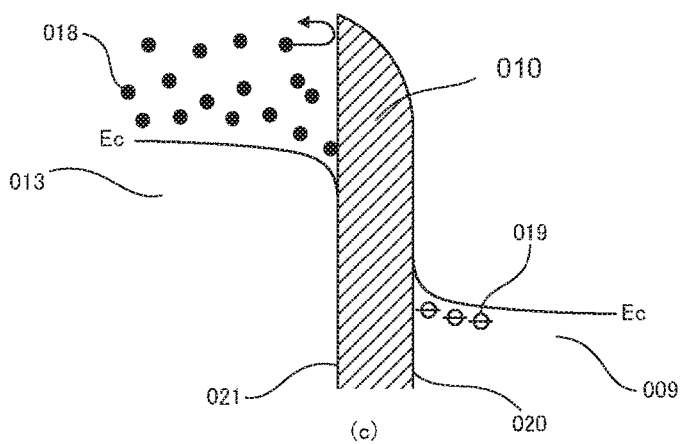

FIG. 4B is obtained by partially enlarging FIG. 4A, in which electrical lines of force are illustrated. The charge density varies depending on a place of the first interface 020 and the second interface 021, and hence the density of the electrical lines of force varies depending on a place in a normal direction of the first interface 020 and the second interface 021, with the result that the electric field intensity varies depending on a place in the normal direction to the first interface 020 and the second interface 021. FIG. 5A, FIG. 5B, and FIG. 5C are each a band diagram for illustrating a difference in electric field intensity applied to the tunnel insulating film 010 in this case.

FIG. 5A is a band diagram of a region C of FIG. 4A and FIG. 4B. FIG. 5B is a band diagram of an intermediate region between the region C and a region D of FIG. 4A and FIG. 4B. FIG. 5C is a band diagram of the region D of FIG. 4A and FIG. 4B. As is understood from FIG. 5A to FIG. 5C, an FN tunnel current is likely to flow in the region C of FIG. 5A, and hence the charge selectively passes through only the region C by adjusting a "0" state write voltage.

Figure 11A:
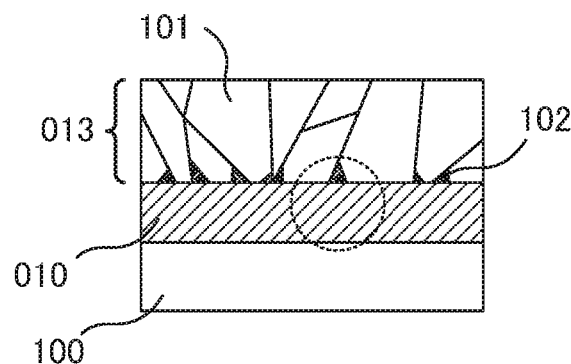
FIG. 11A is a sectional view of the vicinity of a tunnel insulating film in a related-art EEPROM characteristics improving technology described in Japanese Patent Application Laid-open No. 2001-135729.
Figure 11B:
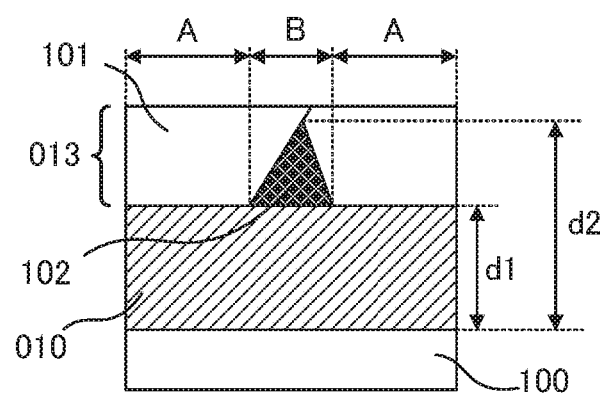
FIG. 11B is an enlarged view of FIG. 11A.

Since the region through which the charge passes can thus be selected by each of the "0" state writing and the "1" state writing, deterioration of the tunnel insulating film 010 can be suppressed by alleviating stress on the tunnel insulating film 010, with the result that the endurance and retention can be improved. Further, in the case of a related-art flat tunnel insulating film having a curvature of 0 which is illustrated in FIG. 8, or in the case of a tunnel insulating film locally including a point having a curvature only on a surface corresponding to the second interface 021 of the present invention which is illustrated in FIG. 11, an electric field applied to the tunnel insulating film in a portion allowing charge to pass therethrough has a state of FIG. 3B or FIG. 5B. However, since an electric field applied to the tunnel insulating film 010 in a portion allowing charge to pass therethrough in the present invention shows a state of FIG. 3C or FIG. 5A, a write voltage can be decreased as compared to those of EEPROMs having the related-art structures illustrated in FIG. 8, FIG. 11A, and FIG. 11B.

Figure 6:
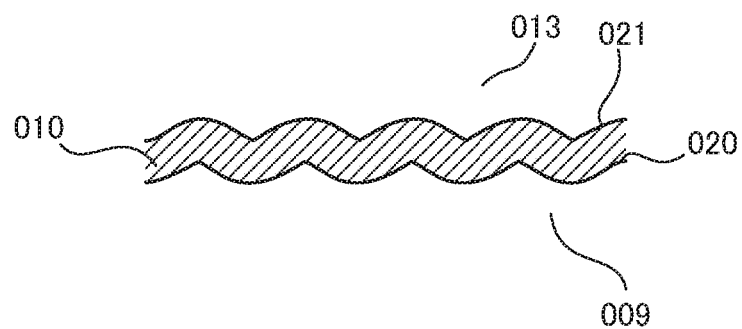
FIG. 6 is a sectional view of the tunnel insulating film in the embodiment of the present invention.

In the uneven structure in the embodiment illustrated in FIG. 1 to FIG. 5C, the interval between the first interface 020 and the second interface 021 is substantially constant. However, the benefits equal to or more than those of the embodiment illustrated in FIG. 1 to FIG. 5C are obtained even by, as illustrated in FIG. 6, sharpening an apex of a convex portion of the first interface 020 to set the curvature of the apex of the convex portion of the first interface 020 to be further larger than that of an opposed concave portion of the second interface 021 in an area in which the first interface 020 is protruded upward in FIG. 6, and meanwhile, further similarly sharpening an apex of a convex portion of the second interface 021 to set the curvature of the apex of the convex portion of the second interface 021 to be further larger than the curvature of an opposed concave portion of the first interface 020 in an area in which the second interface 021 is protruded downward in FIG. 6.

The tunnel insulating film 010 in the embodiment illustrated in FIG. 1 to FIG. 6 has the corrugated structure in a direction (channel length direction) connecting the n-type memory cell transistor drain region 008 and the n-type memory cell transistor source region 011 to each other as illustrated in FIG. 1, but the tunnel insulating film 010 may have the corrugated structure in a direction (channel width direction) perpendicular to the drawing sheet in FIG. 1 to FIG. 6 instead of the channel length direction. Alternatively, the tunnel insulating film 010 may have the corrugated structure in both the channel length direction and the direction (channel width direction) perpendicular to the drawing sheet. In other words, it is only required that, in a certain place of the tunnel insulating film 010 when viewed in plan view, the tunnel insulating film 010 be formed so as to have a curvature in which the curvatures of the first interface 020 and the second interface 021 each change at an identical period with respect to a place.

Further, in the embodiment illustrated in FIG. 1 to FIG. 6, as illustrated in FIG. 3A to FIG. 3C and FIG. 5A to FIG. 5C, it is assumed that the floating gate 013 is made of a semiconductor containing polycrystalline silicon. However, even when the floating gate 013 is made of a metal, the same benefits are obtained.

Figure 12A:
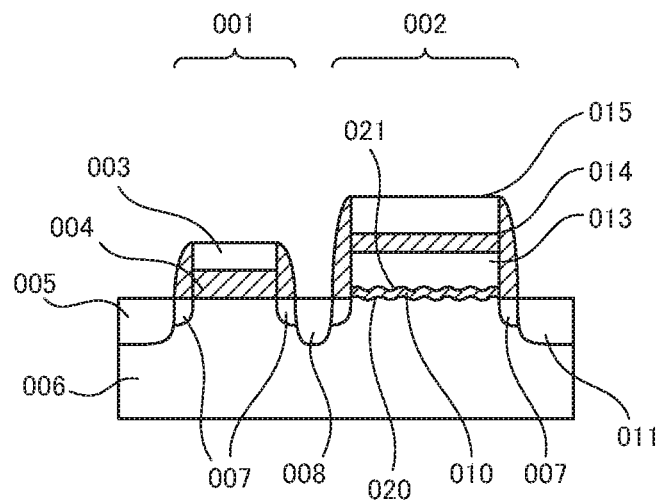
FIG. 12A and FIG. 12B are each a sectional view for illustrating an EEPROM in another embodiment of the present invention, in which a tunnel oxide film is formed on a p-type semiconductor substrate in FIG. 12A, and a tunnel oxide film is formed on a p-type well region in FIG. 12B.
Figure 12B:
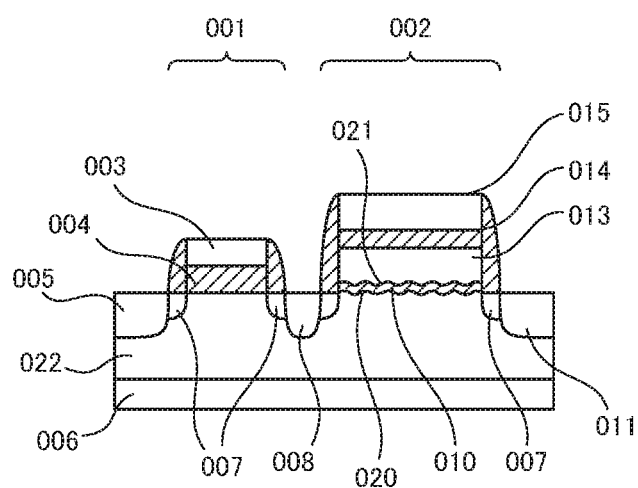

Further, in the foregoing, description is given of the EEPROM including the n-type tunnel drain region 009 as an example, but the present invention can be used also in a memory that does not include the n-type tunnel drain region 009. FIG. 12A and FIG. 12B are each a sectional view of an EEPROM that does not include the n-type tunnel drain region 009 in another embodiment of the present invention. In FIG. 12A, a tunnel insulating film 010 is formed on the p-type semiconductor substrate 006, and in FIG. 12B, the tunnel insulating film 010 is formed on a p-type well region 022. Then, the interface 020 is an interface formed by the p-type semiconductor substrate 006 and the tunnel insulating film 010 in the case of FIG. 12A, and the interface 020 is an interface formed by the p-type well region 022 and the tunnel insulating film 010 in the case of FIG. 12B.

Further, in the foregoing, n-type and p-type polarities are described. Even when the n-type and p-type polarities are reversed, the same benefits can be obtained.

Figure 7A:
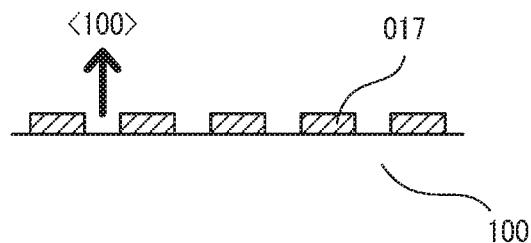
FIG. 7A, FIG. 7B, FIG. 7C, and FIG. 7D are each a sectional view for illustrating a method of manufacturing the tunnel insulating film in the embodiment of the present invention.
Figure 7B:
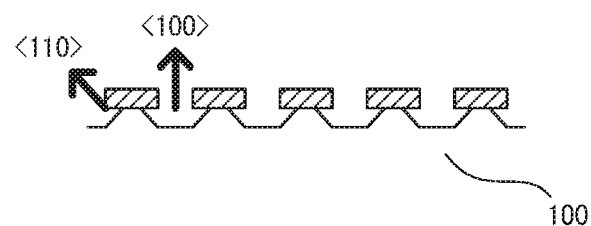
Figure 7C:
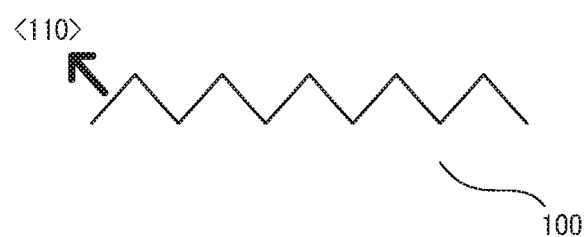
Figure 7D:
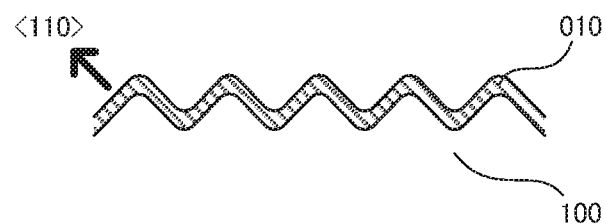

In FIG. 7A, FIG. 7B, FIG. 7C, and FIG. 7D, there is illustrated an example of a method of manufacturing the tunnel insulating film 010 having the uneven structure described above. As illustrated in FIG. 7A, for example, when an etching mask is formed on a semiconductor substrate 100 on which a <100> plane is exposed, and directional etching is performed, for example, a <110> plane having an etching rate lower than that of the <100> plane is exposed as illustrated in FIG. 7B. When etching is further performed, the etching mask is lifted off, and a micropyramid structure having an apex portion and a valley portion, each forming an acute angle, is formed as illustrated in FIG. 7C. When the surface of the micropyramid structure is oxidized, an oxide film having a certain curvature is formed on each of the apex portion and the valley portion of the micropyramid structure due to stress. The oxide film can be used as the tunnel insulating film 010.

In the foregoing, description is mainly given of the semiconductor memory device. However, the present invention is not limited to the semiconductor memory device, and the present invention can be applied to any semiconductor devices to be used by causing charge to pass through a tunnel insulating film.

What is claimed is:

1. A method of manufacturing a semiconductor device, the semiconductor device comprising:
    a semiconductor substrate;
    a tunnel insulating film formed on a surface of the semiconductor device;
    a floating gate formed on the tunnel insulating film; and
    a memory cell transistor drain region and a memory cell transistor source region formed from the surface to an inside of the semiconductor substrate in a vicinity of both ends of the floating gate,
the method comprising:
    preparing an etching mask formed on the semiconductor substrate;
    etching the semiconductor substrate with an etchant having an etching rate varied depending on a plane orientation of the semiconductor substrate; and
    forming the tunnel insulating film on a surface of the etched semiconductor substrate.

* * * * *